(12) United States Patent
Sanville et al.

(10) Patent No.: US 8,352,661 B1
(45) Date of Patent: Jan. 8, 2013

(54) DATA STORAGE SYSTEMS HAVING SEAMLESS SOFTWARE UPGRADES

(75) Inventors: Alex J. Sanville, Ayer, MA (US); Steven D. Sardella, Hudson, MA (US)

(73) Assignee: EMC Corporation, Hopkinton, MA (US)

( * ) Notice: Subject to any disclaimer, the term of this patent is extended or adjusted under 35 U.S.C. 154(b) by 328 days.

(21) Appl. No.: 12/730,275

(22) Filed: Mar. 24, 2010

(51) Int. Cl.
| | |
|---|---|
| H05K 7/10 | (2006.01) |
| G06F 3/00 | (2006.01) |
| G06F 5/00 | (2006.01) |
| G06F 13/00 | (2006.01) |
| G06F 11/00 | (2006.01) |
| G01R 31/08 | (2006.01) |
| G08C 15/00 | (2006.01) |
| H04J 1/16 | (2006.01) |
| H04J 3/14 | (2006.01) |
| H04L 1/00 | (2006.01) |
| H04L 12/26 | (2006.01) |
| H04L 12/28 | (2006.01) |
| H04L 12/56 | (2006.01) |

(52) U.S. Cl. .......... 710/301; 710/38; 710/316; 370/225; 370/226; 370/227; 370/228; 370/419

(58) Field of Classification Search ............ 710/38, 710/301, 316; 370/225–228, 419
See application file for complete search history.

(56) References Cited

U.S. PATENT DOCUMENTS

| | | | | |
|---|---|---|---|---|
| 5,068,853 A | * | 11/1991 | Soma et al. ................. | 714/24 |
| 5,617,547 A | * | 4/1997 | Feeney et al. ............... | 710/316 |
| 5,793,983 A | * | 8/1998 | Albert et al. ................ | 709/239 |
| 6,347,344 B1 | * | 2/2002 | Baker et al. ................. | 710/20 |
| 6,578,092 B1 | * | 6/2003 | Lau et al. .................... | 710/29 |
| 6,578,158 B1 | * | 6/2003 | Deitz et al. .................. | 714/11 |
| 6,633,946 B1 | * | 10/2003 | Hendel ........................ | 710/317 |
| 6,654,898 B1 | * | 11/2003 | Bailey et al. ................. | 713/500 |
| 6,967,950 B2 | * | 11/2005 | Galicki et al. .............. | 370/392 |

(Continued)

FOREIGN PATENT DOCUMENTS

JP 55072260 A * 5/1980

(Continued)

OTHER PUBLICATIONS

"NN80091607: Control Signals for Input Output Bus of a Microprocessor", Sep. 1, 1980, IBM, IBM Technical Disclosure Bulletin, vol. 23, Iss. 4, pp. 1607-1609.*

(Continued)

*Primary Examiner* — Faisal M Zaman
(74) *Attorney, Agent, or Firm* — Krishnendu Gupta; R. Kevin Perkins

(57) ABSTRACT

A data storage system having a pair of CPU modules each one of having a port coupled to a host computer/server and a storage medium for transferring data during an IO transfer. Each one of the modules produces different types of reset signals, one of such types being a software reset signal produced during a software upgrade of the module and other types being produced for events other than during a software upgrade, The other types produced by a first one of the modules disables the port of the first one of the modules; whereas, in response the software reset signal produced by the first one of the modules during an IO transfer, a second one of the modules couples the port of the first one of the modules to the second one of the modules to enable the IO transfer to be processed by the second one of the modules.

4 Claims, 3 Drawing Sheets

U.S. PATENT DOCUMENTS

| | | | |
|---|---|---|---|
| 7,103,057 B2 * | 9/2006 | Yoshizawa | 370/419 |
| 7,305,494 B2 * | 12/2007 | Lee | 710/10 |
| 7,307,948 B2 * | 12/2007 | Infante et al. | 370/225 |
| 7,447,808 B2 * | 11/2008 | Wang et al. | 710/14 |
| 7,457,906 B2 * | 11/2008 | Pettey et al. | 710/316 |
| 7,483,442 B1 * | 1/2009 | Torudbaken et al. | 370/412 |
| 7,952,992 B1 * | 5/2011 | Ghorishi et al. | 370/220 |
| 2002/0065044 A1 * | 5/2002 | Ito | 455/41 |
| 2004/0078632 A1 * | 4/2004 | Infante et al. | 714/5 |
| 2005/0077355 A1 * | 4/2005 | Yamamoto et al. | 235/439 |
| 2005/0157656 A1 * | 7/2005 | Chebrolu | 370/241 |
| 2005/0208944 A1 * | 9/2005 | Okita et al. | 455/436 |
| 2008/0037418 A1 * | 2/2008 | Cole et al. | 370/220 |
| 2008/0120454 A1 * | 5/2008 | Chang et al. | 710/316 |
| 2008/0243990 A1 * | 10/2008 | Mallik et al. | 709/203 |
| 2009/0006884 A1 * | 1/2009 | Cahill et al. | 714/4 |
| 2009/0161534 A1 * | 6/2009 | Matsuura | 370/220 |
| 2009/0319702 A1 * | 12/2009 | Matumura et al. | 710/33 |
| 2010/0088281 A1 * | 4/2010 | Driesen et al. | 707/641 |
| 2010/0262860 A1 * | 10/2010 | Sargor et al. | 714/4 |

FOREIGN PATENT DOCUMENTS

| | | | |
|---|---|---|---|
| JP | 61244146 A | * | 4/1985 |
| JP | 04060813 A | * | 2/1992 |
| JP | 04069759 A | * | 3/1992 |
| JP | 05216566 A | * | 8/1993 |
| JP | 2007109260 A | * | 4/2007 |
| JP | 2007249661 A | * | 9/2007 |

OTHER PUBLICATIONS

Gyung-Su Byun; Yanghyo Kim; Jongsun Kim; Sai-Wang Tam; Chang, M.-C.F.; , "An Energy-Efficient and High-Speed Mobile Memory I/O Interface Using Simultaneous Bi-Directional Dual (Base+RF)-Band Signaling," Solid-State Circuits, IEEE Journal of , vol. 47, No. 1, pp. 117-130, Jan. 2012.*

Anderson, D.; , "Task force on network storage architecture: network attached storage is inevitable," System Sciences, 1997, Proceedings of the Thirtieth Hawaii International Conference on , vol. 1, pp. 725 vol. 1, Jan. 7-10, 1997.*

* cited by examiner

DATA STORAGE SYSTEMS HAVING SEAMLESS SOFTWARE UPGRADES

TECHNICAL FIELD

This disclosure relates generally to data storage systems and methods and more particularly to systems and methods for enabling a seamless transmission of data between a host computer/server and storage media during a software upgrade of the system.

BACKGROUND

As is known in the art, large host computers and servers (collectively referred to herein as "host computer/servers") require large capacity data storage systems. These large computer/servers generally include data processors, which perform many operations on data introduced to the host computer/server through peripherals including the data storage system. The results of these operations are output to peripherals, including the storage system.

One type of data storage system is a magnetic disk storage system having a bank of disk drives. The bank of disk drives and the host computer/server are coupled together through a system interface, sometimes referred to as a storage array. The interface includes CPU modules and operates the storage processors in such a way that they are transparent to the host computer/server. That is, user data is stored in, and retrieved from, the bank of disk drives in such a way that the host computer/server merely thinks it is operating with its own local disk drive. One such system is described in U.S. Pat. No. 5,206,939, entitled "System and Method for Disk Mapping and Data Retrieval", inventors Moshe Yanai, Natan Vishlitzky, Bruno Alterescu and Daniel Castel, issued Apr. 27, 1993, and assigned to the same assignee as the present invention.

One such system is shown in FIG. 1. Here the interface includes a pair of redundant CPU modules (CPU A and CPU B) interconnected through midplane by a PCI Express bus. Each of the pair CPU modules is coupled to both the host computer/server and the bank of disk drives (Disk Storage). This connection may be Fiber Channel, SAS, Ethernet, or any existing or future IO protocol. Only one of these connections from the Host/Server is active during any user data transfer operation, i.e., a so-called I/O transfer. The other connection is there for failover should the active connection fail.

More particularly, in this configuration, each one of the CPU modules includes an IO controller, a PCI-Express Switch, a Processor Complex, a microcontroller, and an OR gate arranged as shown. The OR gate is used to reset the IO controller and the PCI-Express switch in the event of either a system reset signal produced by the processor complex or by the microcontroller. The microcontroller also produces a reset signal for the processor complex.

Assume, for example, that the connection from the host computer/server to a port of one of a plurality of Input/Output (IO) controller units (not shown) within the IO controller in CPU module A is the active link (i.e., the link performing the IO transfer between the host computer/server and the disk storage. User data being to the Disk Storage first comes with, in this configuration, a PCI-Express protocol, to the IO Controller in CPU A. The IO Controller in CPU A converts the IO Protocol to a PCI-Express protocol and forwards the IO transfer data to the PCI-Express Switch within the CPU A. The PCI-Express Switch within the CPU A then routes the data to the CPU Complex within the CPU A where some data processing is performed and the processed user data, after the appropriate checksum is applied, is pushed from the CPU Complex within the CPU A back to the PCI-Express Switch within the CPU A. The data is then routed back through either the same IO Controller unit or potentially another IO Controller unit within the CPU A depending on where the user data is to be stored within the data storage. The user data then leaves a separate port from the IO Controller of CPU A and is written to the Disk Storage.

With such an arrangement, during a software upgrade of CPU Module A, a system reset signal is produced by the processor complex thereby placing the entire CPU Module A in an offline condition and may reset several times. The PCI-Express Switch advises the CPU Module B of this offline condition. It is noted that when the Processor Complex resets, all of the attached PCI-Express Devices reset as well. This allows the Processor Complex to configure everything correctly during the boot process. In this configuration, the Microcontroller is able to reset the Processor Complex and associated PCI Express devices. This Microcontroller monitors voltages and other status and will reset the CPU Complex to prevent damage to module PC board.

During this software upgrade of CPU Module A, all data that was being handled by CPU Module A will failover to CPU Module B and CPU module B will handle user data transfers during the software upgrade of CPU module A. Because of this failover the host computer/server must use a different path (i.e., different IO Port) to access the Disk Storage because the port it was previously using (i.e., the CPU module A port) is offline during the software update to CPU module A. Having the Host computer/server failover when the system is working as expected is not desirable.

SUMMARY

In accordance with the disclosure, a data storage system is provided having a pair of CPU modules each one of having a port coupled to a host computer/server and a storage medium for transferring data during an IO transfer. Each one of the modules produces different types of reset signals, one of such types being a software reset signal produced during a software upgrade of the module and other types being produced for events other than during a software upgrade wherein said other types produced by a first one of the modules disables the port of the first one of the modules whereas, in response the software reset signal produced by the first one of the modules during an IO transfer, a second one of the modules couples the port of the first one of the modules to the second one of the modules to enable the IO transfer to be processed by the second one of the modules.

In one embodiment, each one of the modules comprises: an IO controller having the port connected to the host computer/server and the storage medium; a switch coupled to the IO controller, wherein the switch of one of the pair of modules is coupled to the switch of the other one of the pair of modules; a processor complex coupled to the switch; and a microcontroller coupled to the processor complex. In response any one of said other types of the reset signals the microcontroller in a first one of the pair of CPU modules enables the reset signal produced by such first one of the CPU modules to be passed to the IO controller of the first one of the CPU modules and to the switch of the first one of the CPU modules while, in response to the software reset signal, the microcontroller of the first one of the CPU modules inhibits such reset output signal from passing to the IO controller of the first one of the CPU modules and switch of the first one of the CPU modules. In response to the software reset signal, the microcontroller of a second one of the pair of CPU modules couples the switch of the second one of the pair of CPU modules to the IO controller of the of the first one of the CPU modules through the switch of the first one of the pair of CPU modules.

With such an arrangement, an considering for example the PCI-Express system described above in connection with FIG. 1, the PCI-Express devices are enabled to run uninterrupted while the Processor Complex is resetting and updating software it becomes necessary to block the reset signal to the PCI-Express devices associated with the CPU Complex. In the prior art, the processor complex would reset so would the associated PCI-Express devices. In the present disclosure, whenever the Processor complex knows it is performing an upgrade it tells the Microcontroller over an I2C interface to block future resets to the PCI-Express devices. The Microcontroller would then drive a signal preventing any resets performed by the Processor complex from affecting the associated PCI-Express Devices. After the Software upgrade is complete the CPU Complex resumes control of its PCI-Express Devices and resumes handling data from IO Controller.

In one embodiment, a method is provided for operating a data storage system comprising: a pair of CPU modules each one of having a port coupled to a host computer/server and a storage medium for transferring data during an IO transfer, each one of the modules producing different types of reset signals, one of such types being a software reset signal produced during a software upgrade of the module and other types being produced for events other than during a software upgrade. In response to said other types being produced by said first one of the modules, the first one of the modules disables the port of the first one of the modules whereas, in response the software reset signal produced by the first one of the modules during an IO transfer, a second one of the modules couples the port of the first one of the modules to the second one of the modules to enable the IO transfer to be processed by the second one of the modules.

The details of one or more embodiments of the disclosure are set forth in the accompanying drawings and the description below. Other features, objects, and advantages of the disclosure will be apparent from the description and drawings, and from the claims.

DETAILED DESCRIPTION

Figure 1:
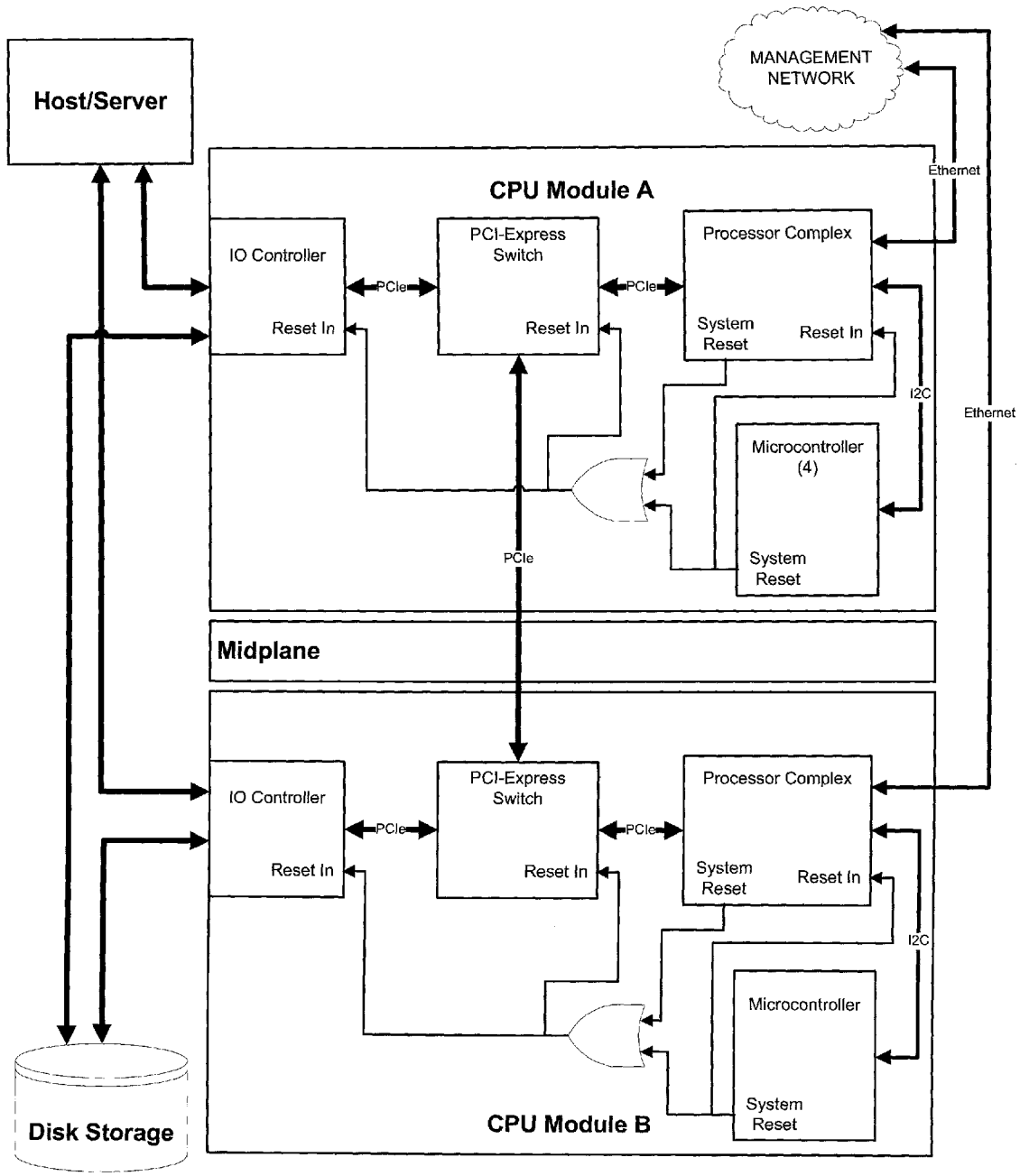
FIG. 1 is a block diagram of a data storage system according to the PRIOR ART.
Figure 2:
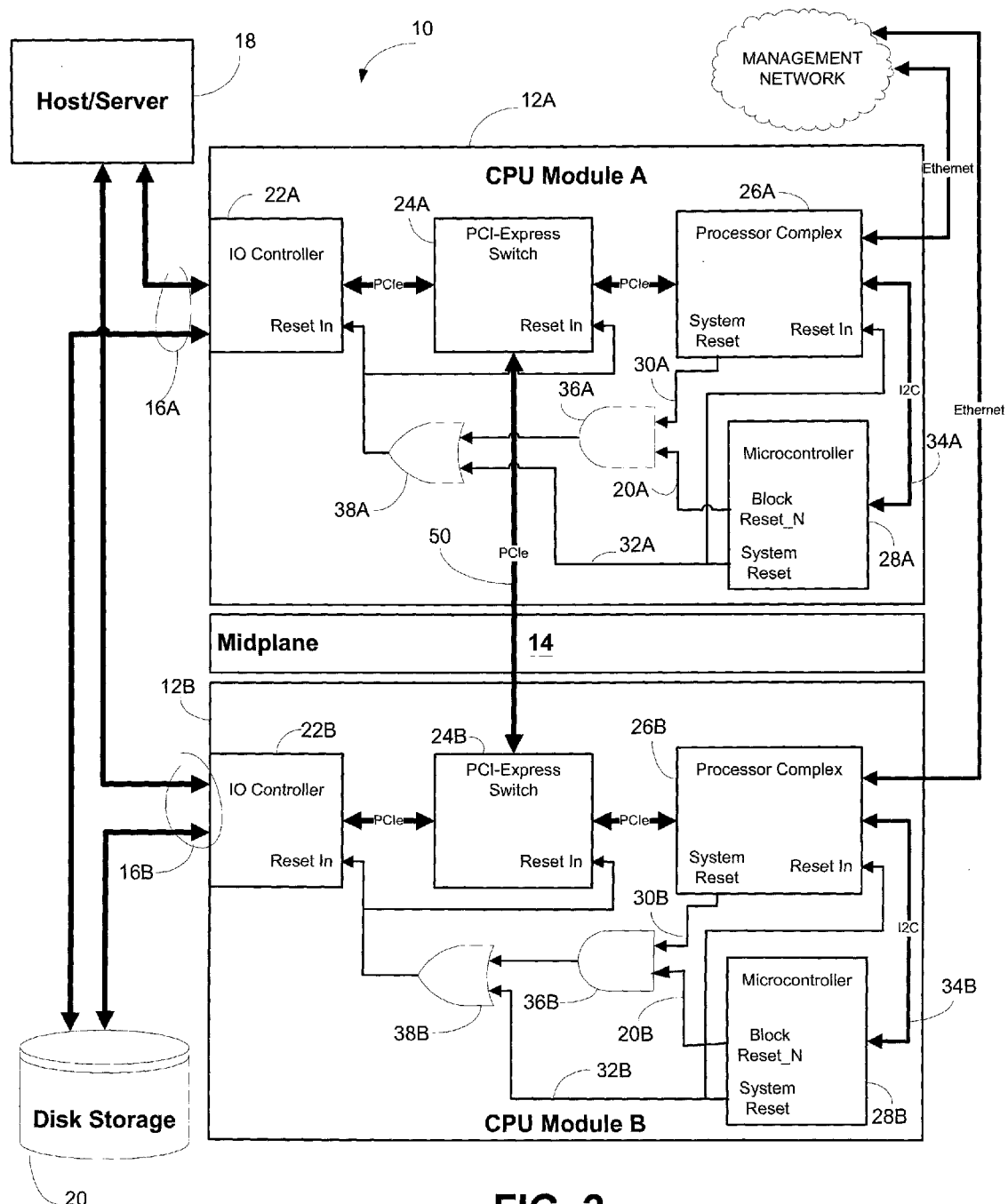
FIG. 2 is a block diagram of a data storage system according to the disclosure.

Referring now to FIG. 2, a data storage system 10 is shown having a pair of CPU modules 12A, 12B interconnected through a midplane 14. Each one of the CPU modules 12A, 12B has IO ports 16A, 16B, respectively, as shown, coupled to a host computer/server 18 and a storage medium 20 (here a bank of disk drives) for transferring user data during an IO transfer between the host computer/server 18 and the storage medium 20.

Each one of the modules 12A, 12B produces different types of reset signals, one of such types being a software reset signal produced during a software upgrade of the module 12A, 12B and other types being produced for events other than during a software upgrade. The other, (non-software upgrade) types of system resets produced by one of the modules disables the IO port of that one of the modules 12A, 12B; whereas, in response the software reset signal produced by one of the modules 12A, 12B during an IO transfer, the other one of the modules 12A, 12B couples the IO port 16A, 16B of the one of the modules 12A, 12B having the software upgrade to the other one of the modules 12A, 12B to enable the IO transfer to be processed by the other one of the modules 12A, 12B. Thus, for example, if module 12A is to have the software therein upgraded during an IO transfer, module 12B performs the IO transfer.

More particularly, each one of the modules 12A, 12B comprises: an IO controller 22A, 22B, respectively, having the IO port 16A, 16B connected to the host computer/server 18 and the storage medium 20; a switch 24A, 24B, respectively, (here a PCI-Express (PCIe) switch) coupled to the IO controller 22A, 22B, respectively, as shown, wherein the switch 22A, 22B of one of the pair of modules 12A, 12B is coupled to the switch 22A, 22B of the other one of the pair of modules 12A, 12B (i.e., switch 24A is coupled to switch 24B here though PCI-Express, as shown); a processor complex 26A, 26B coupled to the switch 24A, 24B, respectively, as shown; and a microcontroller 28A, 28B coupled to the processor complex 26A, 26B, respectively as shown.

Each one of the processor complexes 26A, 26B, and more particularly, the processor complex 26A, 26B, is able to produce a system reset signal on line 30A, 30B respectively. This system reset may be produced for such things as power failure, software failures, hardware failures, hardware upgrades and also when there is a software upgrade required in the processor complex 26A, 26B. Each one of the microcontrollers 28A, 28B is able to produce a system reset signal on line 32A, 32B respectively. This system reset may be produced by the microprocessors 28A, 28B for such things as power failure and over temperature conditions. The processor complex 26A and the microcontroller 34A are interconnected, here with an I2C bus 34A. The processor complex 26B and the microcontroller 34B are interconnected, here with an I2C bus 34B. Microcontroller 28A is advised by processor complex 26A via I2C bus 34A when the processor complex 26A is to have a software upgrade. Likewise, microcontroller 28B is advised by processor complex 26B via I2C bus 34B when the processor complex 26B is to have a software upgrade. Each one of the microcontrollers 28A, 28B is able to produce a "do not block reset" (Block Reset_N) logic signal on line 29A, 29B, respectively. Here, a logic 0 signal is produced by microcontroller 28A on line 29A when processor complex 26A is performing a software upgrade and a logic 1 signal in the absence of a software upgrade to be performed by processor complex 26A. Similarly, in the absence of a software upgrade to be performed by processor complex 26B, a "do not block reset" (Block Reset_N) is produced by microcontroller 28B on line 29B (here the logic signal for Block Reset_N is a logic 1); whereas, if a software upgrade is to be performed by processor complex 26B, the "do not block reset" (Block Reset_N) produced by microcontroller 28B on line 29B is here the logic 0 signal.

Thus, while a system reset signal will be produced on lines 30A and 32A when there is a system reset including a system reset when a software upgrade is to be performed by processor complex 26A, a logic 0 block Reset_N signal is produced by microcontroller 28A only when a software upgrade is to be performed by processor complex 26A (i.e., in the absence of a software upgrade to processor 26A a logic 1 block Reset_N signal is produced by microcontroller 28A). Likewise, while a system reset signal will be produced on lines 30B and 32B when there is a system reset including a system reset when a software upgrade is to be performed by processor complex 26B, a logic 0 block Reset_N signal is produced by microcontroller 28B only when a software upgrade is to be performed by processor complex 26B (i.e., in the absence of a software upgrade to processor 26B a logic 1 block Reset_N signal is produced by microcontroller 28B).

Each one of the modules 12A, 12B includes an AND gate 36A, 36B, respectively and an OR gate 38A, 38B, as shown.

Thus, considering for example module 12A, if there is a system reset produced on line 30A and there is no software upgrade (i.e., the logic signal Block Reset_N produced by microcontroller 28A is a logic 1), the AND gate 26A produces a logic 1 and the OR gate produces a logic 1 thereby resetting the IO controller 22A, the switch 24A and the processor complex 26A. However, if the system reset is for a software upgrade to be performed by complex 26A, microcontroller 28A produces a logic 0 signal for Block Reset_N and the output of AND gate 26A is logic 0. Therefore, in the absence of a system reset produced by the microcontroller 28A, the OR gate 38A produces a logic 0 signal and the IO controller 32A and switch 24A are not reset. Further, the processor complex 28B is advised of this software upgrade through a network connection and couples switch 24B to switch 24A so that the IO transfer is coupled between ports 16A and 16B through IO controller 22A, switch 24A, switch 24B and IO controller 16B. Thus, processor complex 28B handles the IO transfer while the host computer/server "sees" the same IO port (IO port 16A).

Thus, in response any one of non-software system reset signals (such as, for example, hardware failure) produced by the processor controller 26A, 26B, the microcontroller 28A, 28B in a first one of the pair of CPU modules 12A, (for example, microcontroller 28A) enables the output reset signal produced on line 30A by such first one of the CPU modules 12A, 12B (in this example produced by processor complex 26A in module 12A) to be passed to the IO controller 22A, 22B (IO controller 22A, in this example) of the first one of the CPU modules 12A, 12B (module 12A, in this example) and to the switch 24A, 24B (switch 24A in this example) of the first one of the CPU modules while, in response to the software reset signal, the microcontroller of the first one of the CPU modules (microcontroller 12A in this example) inhibits such output reset output signal from passing to the IO controller (IO controller 22A in this example) of the first one of the CPU modules and switch (switch 24A in this example) of the first one of the CPU modules. In response to the software reset signal, the microcontroller of a second one of the pair of CPU modules (microcontroller 28B in this example) couples the switch (switch 24B in this example) of the second one of the pair of CPU modules to the IO controller (controller 22A in this example) of the of the first one of the CPU modules through the switch (switch 24A in this example) of the first one of the pair of CPU modules.

Briefly, in order to allow the PCI-Express devices to run uninterrupted while the Processor Complex is resetting and updating software it becomes necessary to block the reset signal to the PCI-Express devices associated with the CPU Complex. Normally whenever the processor complex would reset so would the associated PCI-Express devices. In the case where the Processor complex knows it is performing an upgrade it would tell the Microcontroller over an I2C bus to block future resets to the PCI-Express devices. The Microcontroller would then drive a signal preventing any resets performed by the Processor complex from affecting the associated PCI-Express Devices.

The CPU Complex would then configure the PCI-Express switch to forward all data coming from IO Controller to the PCI Express Switch on CPU Module B. This allows the CPU Complex to reset as many times as necessary to complete its software upgrade. Meanwhile CPU Module B is handling all data from IO Controller without the Host knowing anything has changed. After the Software upgrade is complete the CPU Complex resumes control of its PCI-Express Devices and resumes handling data from IO Controller.

Figure 3:
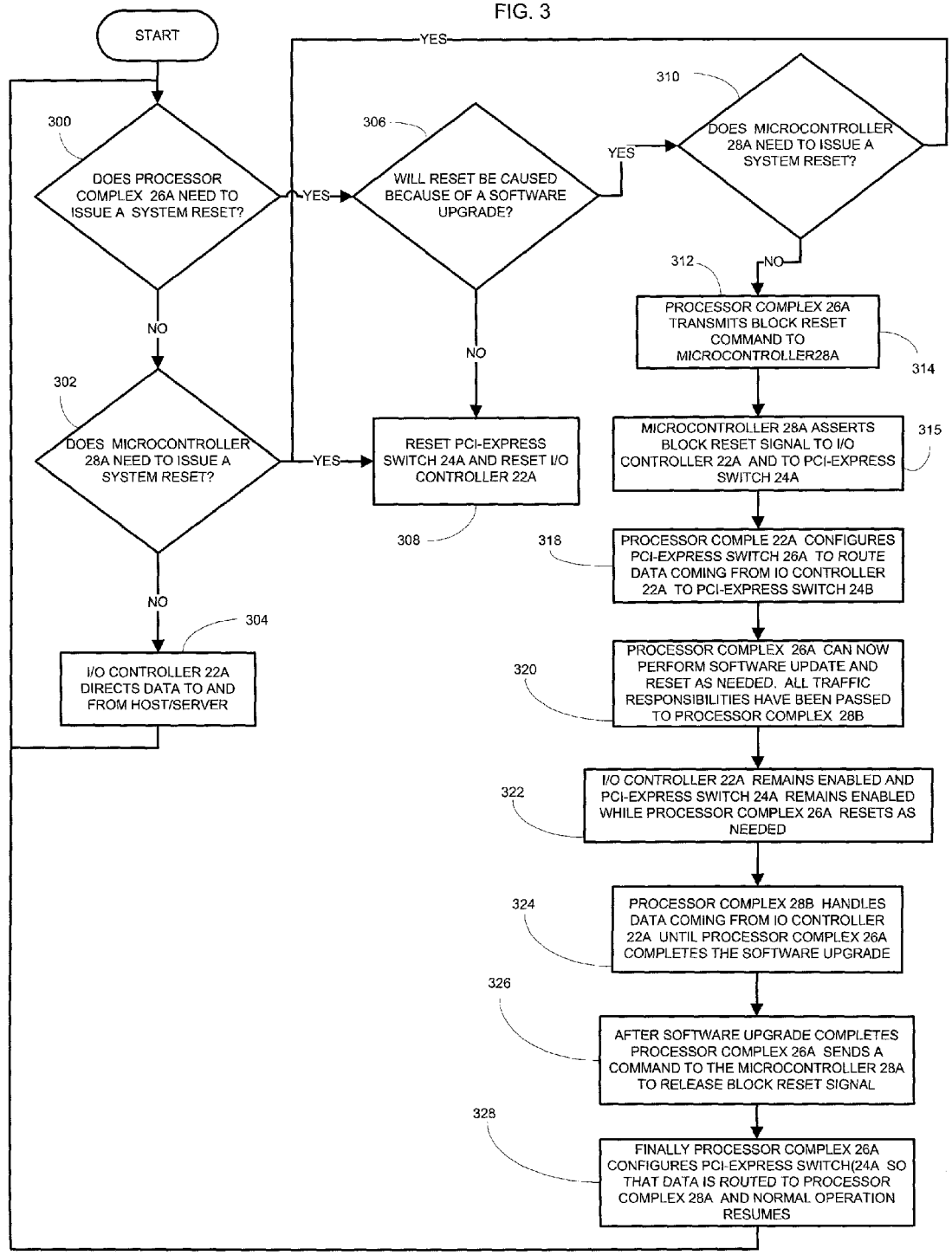
FIG. 3 is a flow diagram of the operation of the data storage system of FIG. 2 according to the disclosure Like reference symbols in the various drawings indicate like elements.

More particularly, considering for example module 12A and referring to FIG. 3, a flow diagram of process is shown. In Step 300 the process determines whether the process complex 26A needs to issue a system reset. If not, the process determines whether the microcontroller 34A needs to issue a system reset (Step 302). If not, the IO controller 22A directs data (the IO transfer) to and from the host/server and the disk storage (Step 304) and the process repeats; however, if it was determined that the processor complex 26A was required in Step 300 to issue a system reset, the process determines whether the reset was caused because of a software upgrade (Step 306. It the required reset was not caused because of a software upgrade, the switch 24A and the IO controller 22A are reset thereby taking module 12A offline (Step 308). Likewise, if is was determined that the microcontroller 28A was required to issue a system reset in Step 302, the switch 24A and the IO controller 22A are reset regardless of whether there is to be a software upgrade of processor complex 22 thereby taking module 12A offline (Step 308).

On the other hand, if it was determined in Step 306 that the processor complex 26A caused a system reset that required a software upgrade and if the microcontroller 28A did not issue a system reset (Step 310): the processor complex 26A transmits a block reset command to microcontroller 28A via the I2C bus 34A (Step 314); the microcontroller 28A asserts a block reset signal to the IO controller 22A and to the PCI-Express switch 24A via AND gate 26A and OR gate 38A (Step 315); the processor complex 26A (in module 12A) configures the PCI-Express switch 24A (in module 12A) Step 318 to route the IO transfer data coming from IO controller 22A (in module 12A) to the PCI-Express switch 24B (in module 12B) via PCI-Express switch 24A (in module 12A) via an PCI Express bus 50 (Step 320); the processor complex 28A (in module 12A) now performs the software update and reset as needed (step 322). It is noted that one port of the PCI Express Switch 24A is connected to the IO Controller 22A and the other port on the PCI Express Switch 24A is connected to PCI Express Switch 24B. Both PCI Express Switch 24A ports are configured to route incoming traffic to the associated Processor Complex 26A. Because of this traffic can be easily rerouted by telling only one PCI-Express Switch to change its behavior to forward all incoming traffic from the IO Controller 22A to the other switch 24B instead of the processor complex 28A. All IO transfer responsibilities at port 16A (in module 12A) have been now passed to processor complex 28B (in module 12B) and the IO controller 22A (in module 12A) remains enabled and the PCI-Express switch 24A (in module 12A) remains enabled while processor complex 26A (in module 12A) resets as needed and the processor complex 28B (in module 12B) handles data coming from the IO controller 22A (in module 12A) until processor complex 28A (in module 12A) completes the software upgrade (Step 324). After the software upgrade completes, the processor complex 26A (in module 12A) sends a command to the microcontroller 28A (in module 12A) to release block reset signal (i.e., Block Reset_N) signal produced by microcontroller 28A becomes a logic 1) (Step 326), and finally the processor complex 26A (in module 12A) configures the PCI-Express switch 24A (in module 12A) so that an IO transfer is routed to the processor complex 26A (in module 12A) and normal operation resumes (Step 328) and module 12B will stop receiving IO transfers as the IO has been re routed in switch 24A to always go to the processor complex 26A)

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A data storage system comprising:
    a pair of CPU modules, each one of the modules having a port coupled to a host computer/server and a storage medium, for transferring user data between the host computer/server and the storage medium during an IO transfer, each one of the modules producing a plurality of different types of reset signals, one of such types of reset signals being a software reset signal produced during a software upgrade of the module and other types being produced for events other than during a software upgrade of the module; and
    wherein, said other types of the reset signals produced by a first one of the pair of modules disables the first one of the modules whereas, in response to the software reset signal produced by the first one of the modules during an IO transfer being performed by the first one of the pair of modules, a second one of the pair of modules, in response to the software reset signal produced by the first one of the pair of modules, couples the port of the first one of the pair of modules to the second one of the pair of modules to enable the IO transfer to be processed by the second one of the pair of modules; and
    wherein the microcontroller of the first one of the CPU modules inhibits such output reset output signal from passing to the IO controller of the first one of the CPU modules and switch of the first one of the CPU modules.

2. A data storage system having a host computer/server coupled to a storage medium, such system comprising:
    a pair of CPU modules, each one of the modules having a port coupled to the host computer/server and the storage medium, for transferring user data between the host computer/server and the storage medium, each one of the modules comprising:
        a processor complex for producing a plurality of different types of reset signals, one of such types of reset signals being a software reset signal produced during a software upgrade of the processor complex and other types of the reset signals being produced for events other than during a software upgrade of the processor complex, wherein the processor complex produces a reset output signal in response to any one of the different types of reset signals produced by the processor complex;
    wherein, any one of said other types of the reset signals that is produced by a first one of the pair of CPU disables the first one of the CPU modules whereas, in response to the software reset signal produced by the first one of the CPU modules during an IO transfer being performed between the host computer/server and the storage medium by a first one of the pair of CPU modules, a second one of the pair of CPU modules couples the port of the first one of the pair of CPU modules to the second one of the pair CPU modules to enable the IO transfer to be processed by the second one of the CPU modules; and
    wherein the microcontroller of the first one of the CPU modules inhibits such output reset output signal from passing to the IO controller of the first one of the CPU modules and switch of the first one of the CPU modules.

3. The data storage system recited in claim 2 wherein:
    each one of the modules comprising:
        an IO controller having a port connected to the host computer/server and the storage medium;
        a switch coupled to the IO controller, wherein the switch of one of the pair of modules is coupled to the switch of the other one of the pair of modules;
        a processor complex coupled to the switch;
        a microcontroller coupled to the processor complex;
    wherein, in response to any one of said other types of the reset signals the microcontroller in a first one of the pair of CPU modules enables an output reset signal produced by such first one of the CPU modules to be passed to the IO controller of the first one of the CPU modules and to the switch of the first one of the CPU modules while, in response to the software reset signal, the microcontroller of the first one of the CPU modules inhibits such output reset signal from passing to the IO controller of the first one of the CPU modules and switch of the first one of the CPU modules; and
    wherein, in response to the software reset signal, the microcontroller of a second one of the pair of CPU modules couples the switch of the second one of the pair of CPU modules to the IO controller of the first one of the CPU modules through the switch of the first one of the pair of CPU modules.

4. A method for operating a data storage system comprising: a pair of CPU modules each one of having a port coupled to a host computer/server and a storage medium for transferring data during an IO transfer, each one of the modules producing different types of reset signals, one of such types being a software reset signal produced during a software upgrade of the module and other types being produced for events other than during a software upgrade, the method comprising:
    in response to said other types being produced by a first one of the modules, the first one of the modules disables the port of the first one of the modules whereas, in response to the software reset signal produced by the first one of the modules during an IO transfer, a second one of the modules couples the port of the first one of the modules to the second one of the modules to enable the IO transfer to be processed by the second one of the modules; and
    wherein the microcontroller of the first one of the CPU modules inhibits such output reset output signal from passing to the IO controller of the first one of the CPU modules and switch of the first one of the CPU modules.

* * * * *